(12) United States Patent
Liu et al.

(10) Patent No.: US 8,085,952 B2
(45) Date of Patent: Dec. 27, 2011

(54) COMBINATION EQUALIZER AND CALIBRATOR CIRCUIT ASSEMBLY FOR AUDIO SYSTEM

(76) Inventors: Mao-Liang Liu, Taipei (TW); Kent Hsu, Sun-Chong (TW)

( * ) Notice: Subject to any disclaimer, the term of this patent is extended or adjusted under 35 U.S.C. 154(b) by 644 days.

(21) Appl. No.: 12/276,330

(22) Filed: Nov. 22, 2008

(65) Prior Publication Data

US 2010/0128902 A1 May 27, 2010

(51) Int. Cl.
*H03G 5/00* (2006.01)
(52) U.S. Cl. .............................. 381/103; 381/56; 381/63
(58) Field of Classification Search .................... 381/56, 381/63, 103; 73/1.46, 1.48, 649
See application file for complete search history.

(56) References Cited

U.S. PATENT DOCUMENTS

| | | | | |
|---|---|---|---|---|
| 3,226,643 A | * | 12/1965 | McNair | 375/268 |
| 5,440,642 A | * | 8/1995 | Denenberg et al. | 381/71.13 |
| 2008/0144839 A1 | * | 6/2008 | Yoshino et al. | 381/56 |
| 2009/0220100 A1 | * | 9/2009 | Ohta et al. | 381/63 |
| 2010/0217602 A1 | * | 8/2010 | Kim | 704/270 |

* cited by examiner

*Primary Examiner* — Thanh V Pham
(74) *Attorney, Agent, or Firm* — Pai Patent & Trademark Law Firm; Chao-Chang David Pai

(57) ABSTRACT

A combination equalizer and calibrator circuit assembly includes a calibrator formed of a frequency control circuit, a signal generator, an amplifier circuit connected with a microphone, a compare circuit and a display circuit and connected to the front end of an equalizer set. Calibration is made through the calibrator prior to audio system reproduction, wherein the frequency control circuit provides a reference frequency and different test frequencies for causing the signal generator to generate respective sound signals for output through a speaker; the microphone picks up these sound signals for comparison with respective reference values by the compare circuit; and the display circuit displays the respective comparison results. By means of adjustment through respective adjust circuits, signals of test frequencies are standardized so that the music played through the audio system is well calibrated without sound spectrum distortion due to space or audio system discrepancy.

3 Claims, 4 Drawing Sheets

COMBINATION EQUALIZER AND CALIBRATOR CIRCUIT ASSEMBLY FOR AUDIO SYSTEM

BACKGROUND OF THE INVENTION (a) Field of the Invention

The present invention relates to audio systems and more particularly to an analog circuit design of combination equalizer and calibrator circuit assembly for audio system that allows pre-calibration of an audio system.

(b) Description of the Prior Art

An equalizer or tone control is commonly used in an audio system to correct, or equalize, the frequency response of a signal. As shown in FIG. 1, when an audio player, such as a CD player, a DVD player, or an AM/FM radio tuner or any other sound source outputs an audio signal to the input end of an equalizer, the frequency and amplitude of the audio signal are adjusted by the equalizer, then the signal outputted is sent to a volume control circuit, then the signal is amplified by an audio amplifier to drive a speaker for audio output. At this time, a user may manually adjust the amplitude of each predetermined frequency without regard to acoustic balance. Regular audio systems may have adjusting means for high frequency control, middle frequency control, low frequency control, tone control, or graphic equalizer tone control, however they do not allow calibration. A user may calibrate an audio system manually according to one's personal preferences. This calibration method cannot achieve balanced frequency and amplitude responses. On regular audio reproduction devices, more particularly, speakers, it is difficult to obtain a balanced frequency response. Especially at low frequency band, a standing wave may remain in a constant position in a space corresponding to a specific frequency, causing variations in sound strength, i.e., formation of wave peak and wave valley in the space. This variation results in an amplitude distortion. It causes an uncomfortable hearing event. This problem exists in regular audio systems, and is difficult to eliminate.

A method is known to have independent devices such as signal generator, spectrum analyzer, test microphone, graphic equalizer, audio amplifier, speaker system, etc., be used together for testing and calibrating an audio system. However, these test systems are expensive systems. The operation of these test systems requires a special technique. Only professional technicians can use these systems. Therefore, these test systems are commonly used for testing space responses such as in concert hall, opera theater, or on stage for considerations in correction of the curvature of the wall, modification of upholstery materials, or installation of acoustic diffusers or acoustic absorbing materials to reduce standing waves and improve the effect for listening. However, these professional test devices are expensive and require much installation space, not affordable by an ordinary user.

It is well known that an audio system must be well calibrated to provide an accurate sound effect. However, the equalizer and tone control of a regular audio system are simply provided for adjustment subject to the user's preference. Therefore, it is desirable to provide an audio system that eliminates the aforesaid problems and achieves perfect reproduction of the original sound.

SUMMARY OF THE INVENTION

The present invention has been accomplished under the circumstances in view. It is one object of the present invention to provide a combination equalizer and calibrator circuit assembly for audio system which eliminates the problem of unbalanced amplitude and standing wave interference caused by the speakers of the audio system and which reduces the space in which the audio system needs to be installed, thus improving the tone quality for listening.

To achieve this and other objects of the present invention, a microphone is use to pick up speaker output sound corresponding to each predetermined frequency point for comparison with a respective reference value so that the amplitude of every frequency point is equalized, eliminating amplitude distortion due to discrepancies in audio systems, speakers or space. By means of the application of the combination equalizer and calibrator circuit assembly, the output frequency spectrum (frequency and amplitude) of the audio output from the audio system is close to that of the original sound.

DETAILED DESCRIPTION OF THE PREFERRED EMBODIMENTS

Figure 1:
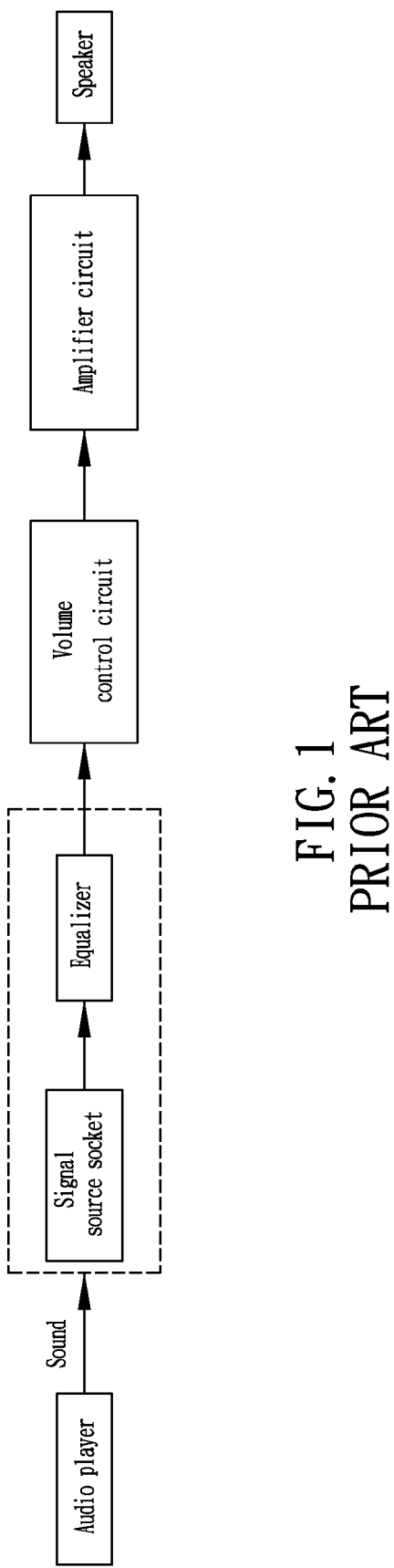
FIG. 1 shows a block diagram of an audio system according to the prior art.
Figure 2:
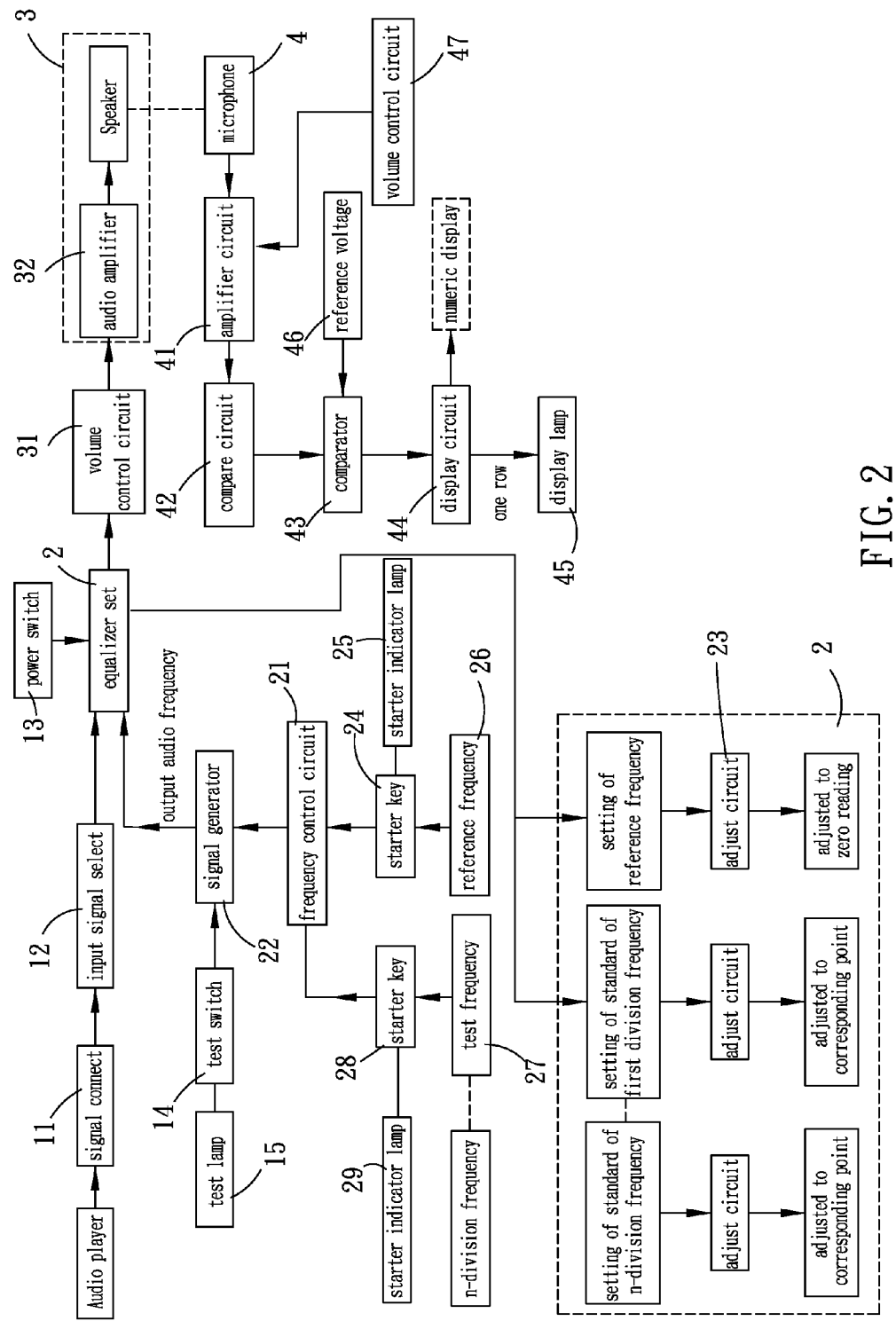
FIG. 2 shows a block diagram of an audio system constructed according to the present invention.
Figure 3:
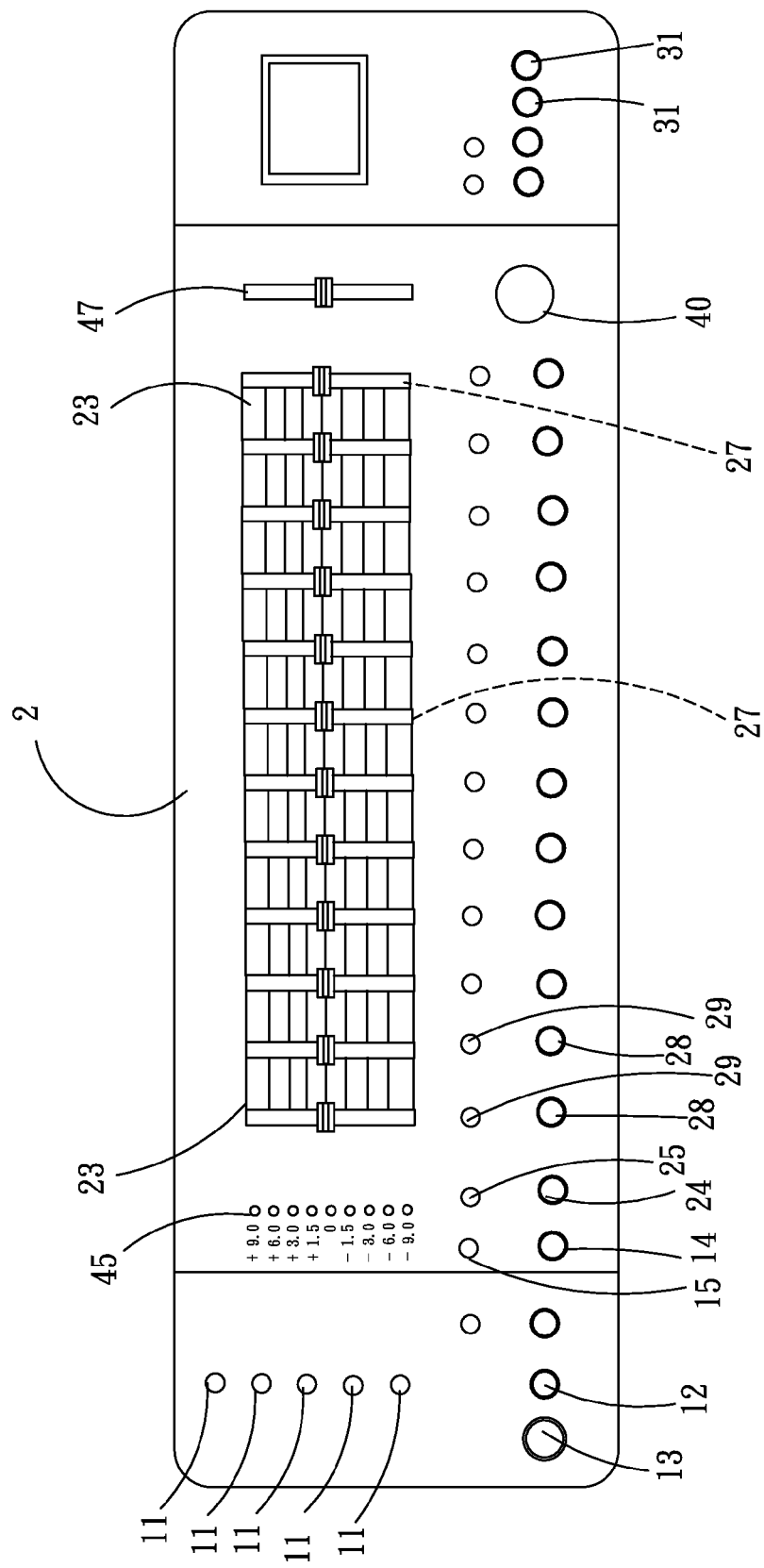
FIG. 3 is a front view of the face panel of the audio system constructed according to the present invention.
Figure 4:
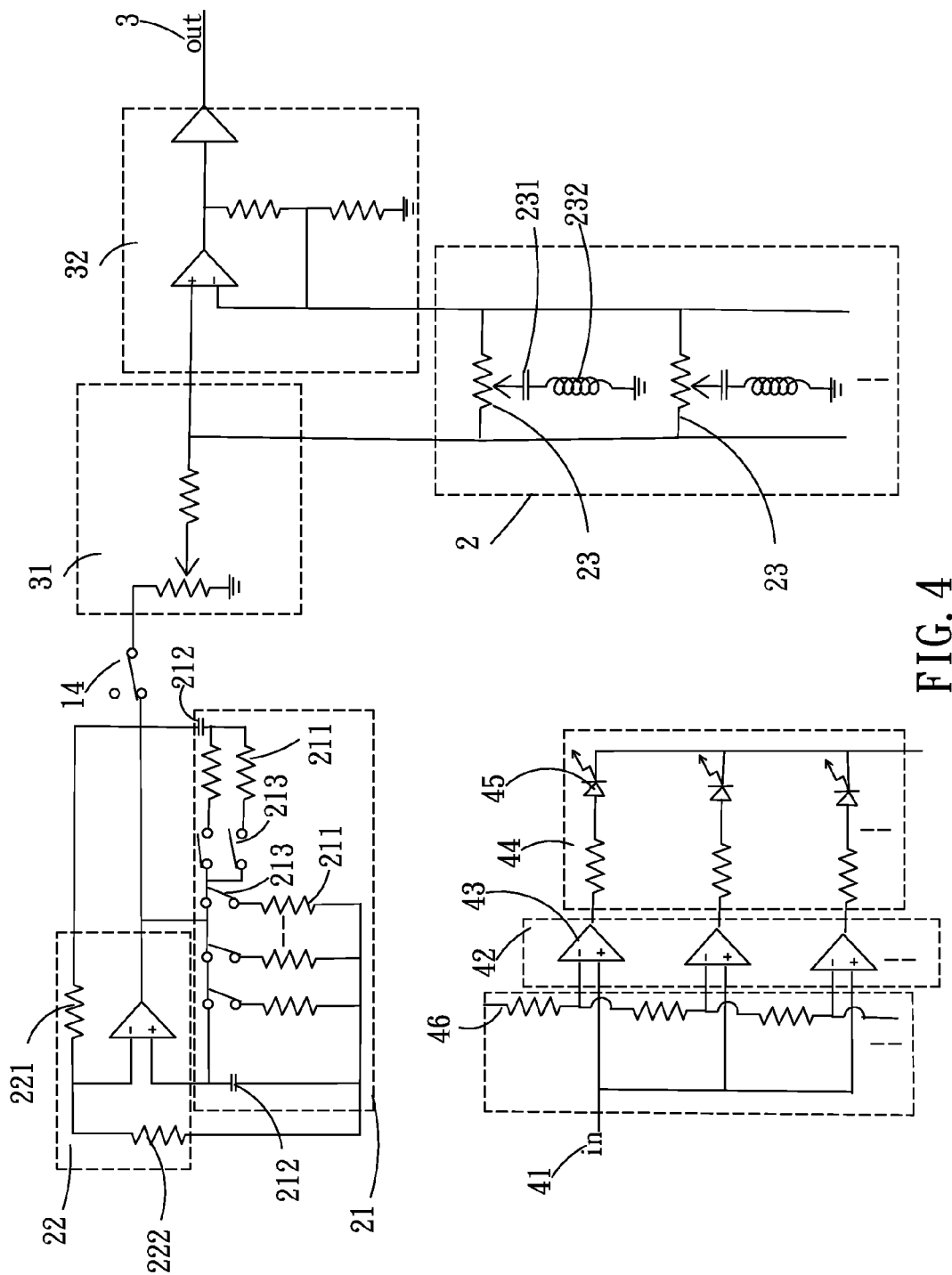
FIG. 4 is a circuit diagram of a part of the audio system constructed according to the present invention.

Referring to FIGS. 2~4, an audio system comprises a housing (see FIG. 3). The housing has installed therein a plurality of signal connects 11, an input signal select 12 for selecting one of the signal connects 11 for audio signal input, a power switch 13, an equalizer set 2 providing a plurality of adjust circuits 23, an audio output device, for example, a speaker 3 electrically connected to the equalizer set 2, a volume control circuit 31 for regulating the output sound volume of the speaker 3, and an audio amplifier 32 for amplifying inputted audio signal for output through the audio output device, e.g. the speaker 3.

The main characteristic of the audio system of the present application is its audio calibration. The audio system comprises a test switch 14 electrically connected to the calibrator and a test lamp 15 electrically connected to the test switch 14. The housing of the audio system further has installed therein a microphone socket 40 for connection of an external microphone 4, and an amplifier circuit 41, which is mounted inside the housing and electrically connected to the microphone socket 40 for sound level control circuit 47.

For pre-calibration, operate the test switch 14 to turn on the calibrator signal. As shown in FIG. 2, the test switch 14 is electrically connected with a signal generator 22. The signal generated by the signal generator 22 is sent to the adjust circuits 23 of the equalizer set 2. The signal generator 22 is electrically connected with a frequency control circuit 21 that provides a reference frequency 26 and a plurality of test frequencies 27. Starter keys 24 and 28 are respectively electrically connected to the reference frequency 26 and the test frequencies 27. Starter indicator lamps 25 and 29 are respectively electrically connected to the starter keys 24 and 28 for operation status indication. At first, the reference frequency 26 provides a sound signal. The volume of this sound signal is adjustable through the volume control circuit 31. The user adjusts the volume control according to the sound volume outputted through the speaker 3 and heard by the user. Further, the sound signal outputted from the speaker 3 is transmitted through air and picked up by the microphone.

The microphone 4 can be a broadband type professional equipment. The input sound signal of the microphone 4 is processed through the amplifier circuit 41, which has electrically connected thereto a compare circuit 42 and a display circuit 44. The compare circuit 42 provides the input sound signal to a comparator 43 for comparison with a reference voltage 46. The display circuit 44 displays the comparison result obtained from the comparator 43 by means of display lamps 45 that correspond to different display values (see FIG. 3). Alternatively, the display circuit 44 can be configured to display the comparison result by means of an LED or LCD type digit 7 segment display subject to an IC control.

If the display of the reference frequency does not show the zero point (the corresponding lamp or digit value is not in indication), operate the sound level control circuit 47 that is electrically connected to the amplifier circuit 41 for regulating the volume of the microphone 4, adjusting the display reading to zero to set the reference frequency. Thereafter, test the sound of the test frequencies and regulate their volume individually.

Normally, 1000(1K)Hz is set as the reference frequency, and the frequency range 16 HZ~20 KHZ or the low frequency band 18~180 Hz is divided by means of an one-third-octave band filter into 18, 23, 29, 36, 45, 57, 72, 90, 114, 143 and 180 HZ frequency points. In regular audio equipment, it is most difficult to have the low-frequency response of the speakers be will done. Further, the distance between the speaker and the back wall affects the volume of the low-frequency sound. In order to lower the degree of complexity of the circuit, the present preferred embodiment processes low frequencies only. The sound volume (wave amplitude) varies with the frequencies relative to the audio system and the space standing wave. By means of adjusting the adjust keys of the adjust circuits 23 corresponding to the respective frequencies, the reading of the display circuit 44 display is adjusted to zero, respectively. After the adjustment is done, switch off the test switch 14. Thereafter, audio player signal is connected to the calibrated equalizer set 2, and then amplified by the audio amplifier 32 for output through the speaker 3.

As shown in FIG. 4, the signal generator 22 is a Wien Bridge signal generator comprising an OP amplifier and a pair of resistors 221 and 222 for gain control; the frequency control circuit 21 comprises an RC bridge circuit comprising a resistor 211 and a capacitor 212. The signal generator 22 has electrically connected thereto a plurality of interlock-switches 213. By means of changing the value of the resistor 211 or capacitor 212, the oscillation frequency is relatively changed. The values of the capacitors 231 and inductors 232 of the adjust circuits 23 of the equalizer set 2 determine the frequency. The inductors 232 and capacitors 231 of the equalizer set 2 correspond to the oscillation frequencies of the frequency control circuit 21. The variable resistors of the adjust circuits 23 of the equalizer set 2 can be adjusted rightwards to raise the amplification or leftwards to reduce the amplification.

The part of the compare circuit 42, comparator 43, display circuit 44, display lamp 45 and reference voltage 46 of the circuit diagram shown in FIG. 4 is a simplified circuit structure relative to the block diagram shown in FIG. 2.

In conclusion, the invention adds a microphone circuit and a compare circuit to constitute a semi-automatic mode, enabling a user to set the zero reading of the reference frequency for reference frequency adjustment control and zero reading adjustment control of each frequency point so that the audio system and the space response are nearly standardized for balanced frequency-spectrum response, allowing pre-calibration despite of space or audio system discrepancy. Therefore, the free adjustment of tone control of the present invention is completely different from the prior art design, i.e., the invention allows the audio system to be calibrated subject to the space environment to balance the frequency spectrum for best hearing effects. By means of the application of the present invention, the frequency response in any dimensions of space can be balanced, achieving perfect reproduction of the original sound.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A combination equalizer and calibrator circuit assembly, comprising: an equalizer set and a calibrator, said equalizer set comprising a plurality of adjust circuits, said calibrator being connected to a front end of said equalizer set and comprising a frequency control circuit, a signal generator, an amplifier circuit, a compare circuit, and a display circuit, wherein said signal generator is electrically connected to said adjust circuits of said equalizer set and said frequency control circuit;

said frequency control circuit provides a reference frequency and a plurality of test frequencies;

said amplifier circuit is connected with a microphone and electrically connected to said compare circuit;

said compare circuit is electrically connected to said display circuit through a comparator thereof, and is capable of inputting a reference voltage; and said equalizer set is connected with a speaker, whereby said frequency control circuit is controlled to output said reference frequency for receiving by said microphone, for enabling said reference frequency to be amplified by said amplifier circuit and then provided to said compare circuit for comparison with said reference voltage so that said display circuit displays the comparison result; when the comparison result is nonzero, one respective sound level control circuit of said amplifier circuit is adjusted to zero point as the reference point for comparison, and then said frequency control circuit is controlled to output said test frequencies for adjustment through the respective adjust circuits of said equalizer set so that said display circuit indicates the respective zero point, and then an audio player is allowed to output a sound signal through said equalizer set for causing said speaker to produce sound.

2. The combination equalizer and calibrator circuit assembly as claimed in claim 1, further comprising a test switch electrically connected to a front end of said signal generator.

3. The combination equalizer and calibrator circuit assembly as claimed in claim 1, further comprising a set of test starter keys respectively electrically connected to said frequency control circuit for controlling the output of said reference frequency and said test frequencies respectively, and a plurality of starter indicator lamps respectively electrically connected to said test starter keys for indication of operation status of said test starter keys.

* * * * *